(12) United States Patent
von Ehrenwall

(10) Patent No.: US 6,461,936 B1
(45) Date of Patent: Oct. 8, 2002

(54) DOUBLE PULLBACK METHOD OF FILLING AN ISOLATION TRENCH

(75) Inventor: Andreas von Ehrenwall, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/037,551

(22) Filed: Jan. 4, 2002

(51) Int. Cl.[7] ............................................... H01L 21/76
(52) U.S. Cl. ....................................... 438/424; 438/437
(58) Field of Search ..................... 438/400, 424–453

(56) References Cited

U.S. PATENT DOCUMENTS 5,872,045 A * 2/1999 Lou ............................ 438/432
5,893,744 A * 4/1999 Wang ......................... 438/491

\* cited by examiner

*Primary Examiner*—Jey Tsai
(74) *Attorney, Agent, or Firm*—Stanton Braden

(57) ABSTRACT

Disclosed is a method of filling an isolation trench etched through a silicon nitride layer down into a silicon substrate, comprising performing a first pullback of said nitride layer away from said trench so as to expose trench corners of said trench so as to optimize corner rounding as desired, provided a silicon oxide trench liner for said trench, performing a second pullback of said silicon nitride layer away from said trench so as to expose a sufficient amount of underlying layer adjacent to said trench corners to effectively protect said trench corners with a subsequent protective fill, providing said protective fill of sufficient thickness to fill said trench and cover said substrate adjacent to said trench corners.

18 Claims, 3 Drawing Sheets

DOUBLE PULLBACK METHOD OF FILLING AN ISOLATION TRENCH

FIELD OF THE INVENTION

This invention relates to the pullback of pad nitrides during the manufacture of semiconductor devices.

BACKGROUND OF THE INVENTION

In the current process of manufacturing semiconductor devices the corner rounding of single trench isolation (STI) corners is achieved by a pad nitride pullback, followed by a liner oxidation. The amount of pad nitride pullback is a trade off between corner protection (requires large pullback) and corner shape (smaller pullback, optimized together with liner oxidation). What is needed is a method that substantially optimizes both corner protection and corner shape.

SUMMARY OF THE INVENTION

Disclosed is a method of filling an isolation trench etched through a silicon nitride layer down into a silicon substrate, comprising performing a first pullback of said nitride layer away from said trench so as to expose trench corners of said trench so as to optimize corner rounding as desired, providing a silicon oxide trench liner for said trench, performing a second pullback of said silicon nitride layer away from said trench so as to expose a sufficient amount of underlying layer adjacent to said trench corners to effectively protect said trench corners with a subsequent protective fill, providing said protective fill of sufficient thickness to fill said trench and cover said substrate adjacent to said trench corners.

In another aspect of the invention, said underlying layer comprises a silicon oxide layer binding said silicon nitride layer to said substrate, said silicon oxide layer is etched back along with said silicon nitride layer during said first pullback, and said silicon oxide layer is not substantially etched during said second pullback.

In another aspect of the invention, said first pullback is a hydrofluoric acid wet etch.

In another aspect of the invention, said second pullback is a phosphoric acid wet etch.

In another aspect of the invention, said second pullback etches back said nitride layer about 100 angstroms from said trench corners.

In another aspect of the invention, said protective fill is a high density plasma silicon oxide fill.

In another aspect of the invention, said protective fill is a TEOS fill.

In another aspect of the invention, said trench liner is provided by thermal oxidation of the walls of said trench.

In another aspect of the invention, said thermal oxidation is executed in a manner to optimize corner rounding.

Disclosed is a method of filling an isolation trench etched through silicon nitride and oxide layers down into a silicon substrate, said oxide layer binding said nitride layer to said substrate, comprising performing a first pullback of said nitride and oxide layers away from said trench so as to expose trench corners of said trench so as to optimize corner rounding as desired, providing a silicon oxide trench liner for said trench, performing a second pullback of said silicon nitride layer away from said trench so as to expose a sufficient amount of underlying silicon oxide layer adjacent to said trench corners to effectively protect said trench corners with a subsequent protective fill, providing said protective fill of sufficient thickness to fill said trench and cover said substrate adjacent to said trench corners.

In another aspect of the invention, said first pullback is a hydrofluoric acid wet etch.

In another aspect of the invention, said second pullback is a phosphoric acid wet etch.

In another aspect of the invention, said second pullback etches back said nitride layer about 100 angstroms from said trench corners.

In another aspect of the invention, said protective fill is a high density plasma silicon oxide fill.

In another aspect of the invention, said protective fill is a TEOS fill.

In another aspect of the invention, said trench liner is provided by thermal oxidation of the walls of said trench.

In another aspect of the invention, said thermal oxidation is executed in a manner to optimize corner rounding.

Disclosed is a method of filling an isolation trench etched through silicon nitride and oxide layers down into a silicon substrate, said oxide layer binding said nitride layer to said substrate, comprising performing a first pullback of said nitride and oxide layers away from said trench so as to expose trench corners of said trench so as to optimize corner rounding as desired, providing a silicon oxide trench liner for said trench by thermal oxidation of the walls of said trench, performing a second pullback of said silicon nitride layer, but not of said silicon oxide layer, away from said trench so as to expose a sufficient amount of underlying silicon oxide layer adjacent to said trench corners to effectively protect said trench corners with a subsequent protective fill, providing said protective fill of sufficient thickness to fill said trench and cover said substrate adjacent to said trench corners, said protective fill of a material selected from high density plasma silicon oxide or TEOS, planarizing said protective fill down to the level of said silicon nitride layer, and removing said silicon nitride and silicon oxide layers not covered by said protective fill.

DETAILED DESCRIPTION OF PREFERRED EMBODIMENTS

Referring to FIGS. 2a through 2d, it will be instructive to review a typical method of preparing an isolation trench in the semiconductor art.

Figure 2A:
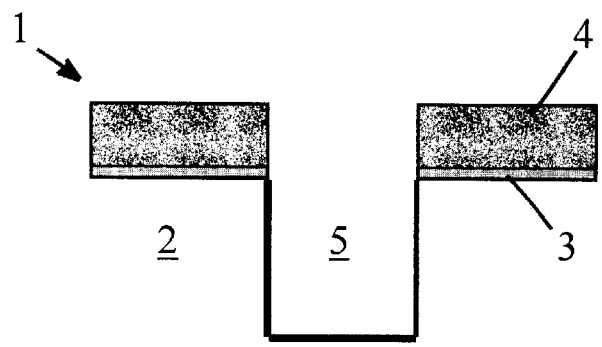
FIGS. 2a through 2d show process steps of the prior art.

Referring to FIG. 2a, a semiconductor wafer 1 comprises a silicon substrate 2 upon which is deposited a pad silicon oxide layer 3 and a pad silicon nitride layer 4. A trench 5 is etched through the oxide 3 and nitride 4 layers down into the substrate 2. The oxide layer 3 serves to correct for the large difference in the coefficient of thermal expansion between the silicon nitride layer 4 and the substrate 2. The pad nitride 4 serves as a hardmask for the silicon trench etch and as a stopping layer for a later CMP process as described below.

Figure 2B:
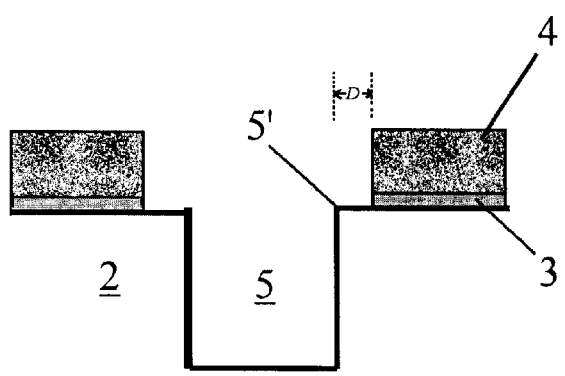

Referring to FIG. 2b, the pad oxide 3 and pad nitride 4 are pulled back away from the trench 5 by an RIE etch selective for oxides and nitrides with respect to silicon. This may be accomplished with a wet etch process selective to silicon, such as a HF/Ethylenglycol wet etch.

The objective is to pull back the nitride from the corner by a distance D that is far enough to sufficiently expose the isolation trench corners 5' for subsequent oxidation, but not so far as to cause excessive pullback. Excessive pullback implies that the corners are too sharp, thereby increasing the danger of shorting out the device gate to the substrate 2. There is an optimum amount of pullback that gives the best corner rounding. This optimum amount depends on the following liner oxidation process.

Figure 2C:
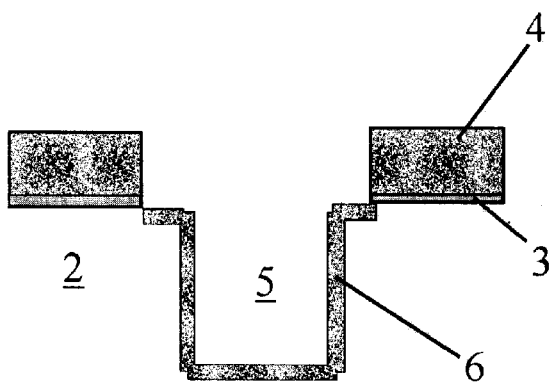

Referring to FIG. 2c, the trench 5 is provided with an oxide liner 6 by thermal oxidation of the trench walls. The thicker the liner 6, the more rounded the corners 5' may be, but the more time-consuming and energy-consuming the manufacturing process.

Figure 2D:
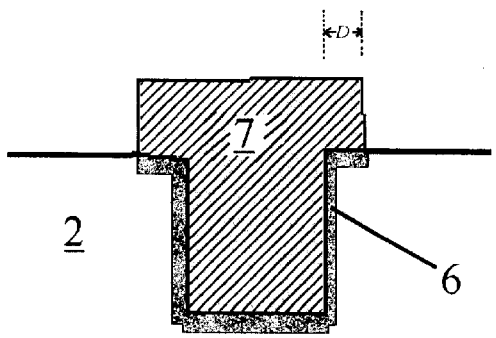

Referring to FIG. 2d, an HDP oxide fill 7 is deposited on top of the pad nitride 4 and within the trench, followed by a CMP process which polishes back the HDP oxide 7 to the level of the pad nitride 4, using the nitride as a CMP stop. Afterwards, the nitride and oxide layers are stripped off. As can be seen, the corners 5' are protected by the HDP oxide fill only to the distance D from the pullback step of FIG. 2b.

As stated above, the prior art method requires a tradeoff between protecting the trench corners 5" and retaining the shape of the trench corners 5' At this point in the process the corner is protected, but as further processing continues on the devices, the covering HDP oxide 7 is incrementally removed whenever another oxide etch step is executed. Eventually, the corners are exposed when the gate oxide is grown. When gate oxides are grown on sharp corners, the electric field at the sharp corners is higher compared to rounded corners. This higher electrical field will often lead to degraded device performance. The method of the invention, as shown in FIGS. 1a through 1e, provides a double pullback method which eliminates this tradeoff by permitting both corner protection and corner rounding.

Figure 1A:
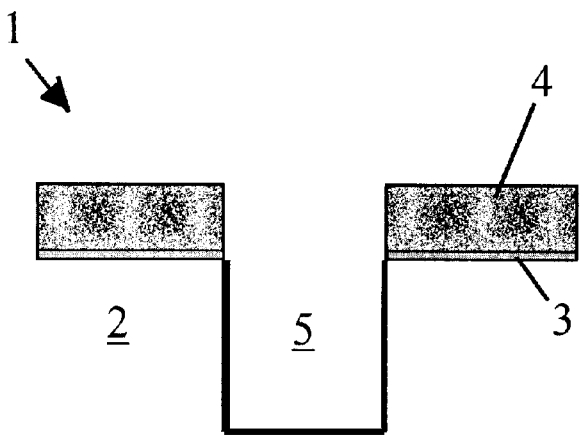
FIGS. 1a through 1e show process steps of the invention.

We now turn our attention to the method of the invention. Referring to FIG. 1a, an isolation trench is etched as in the prior art.

Figure 1B:
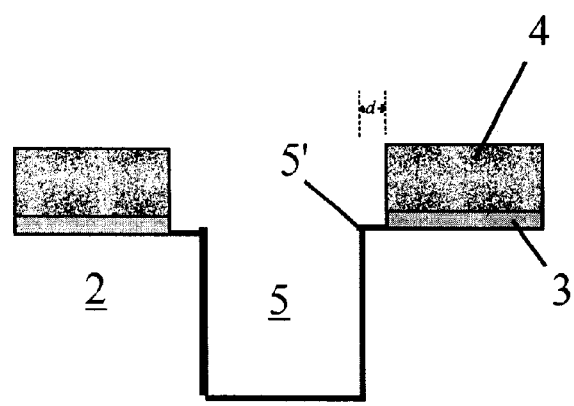

Referring to FIG. 1b, a first pullback is executed, but here the pullback distance d from the trench 5 is smaller than that of the prior art. The amount of pullback is optimized dependent upon the thickness of the liner oxidation. The chemistry used need be no different than as in prior art. Again, there is no fixed time which has to be used because it highly depends on the used liner oxidation (especially on the thickness of the liner oxide). The optimum pullback amount for optimal corner rounding is almost always significantly smaller than the pullback of the prior art for equivalent liner thicknesses, hence:

$d<D$, or even $d<<D$

Figure 1C:
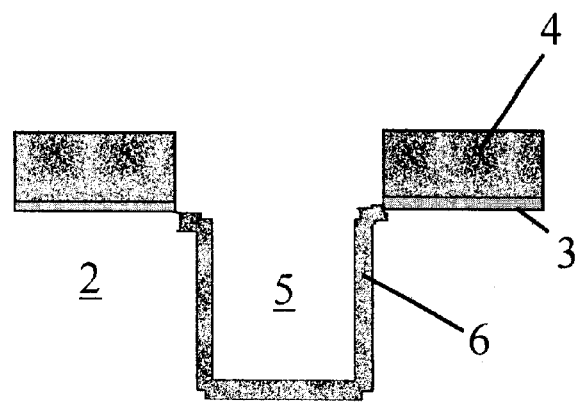

Referring to FIG. 1c, a liner oxide 6 is provided by thermal oxidation of the exposed silicon.

Figure 1D:
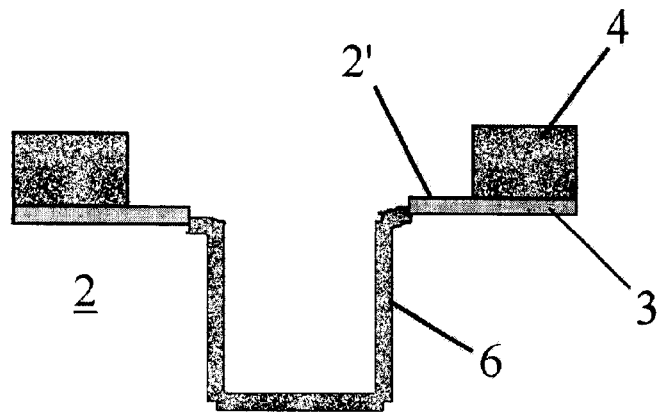

Referring to FIG. 1d, a second pullback is performed that etches off the oxide and nitride layers away from the trench to an extent sufficient to substantially expose an area 2' of substrate 2 adjacent to the trench corners 5'. This second pullback uses a different chemistry than the first pullback because this second pullback will etch the pad nitride 4 selective to the pad oxide 3.

Preferred etches for silicon nitride include phosphoric acid ($H_3PO_4$) and sodium hydroxide (NaOH) isotropic wet etches, which are selective with respect to silicon oxide, organic polymers, polysilicon, silicon, and metals. These etches are effected by immersing the wafer in an aqueous solution of NaOH or $H_3PO_4$ at temperatures of generally 80° C. or more, preferably 100° C. or more, for sodium hydroxide etches and generally 150° C. or more, preferably 180° C. or more, for phosphoric acid etches.

When performing a phosphoric acid etch, it is desirable to maintain the concentration of etchant in solution with reflux. Refluxed, boiling phosphoric acid at 180° C. has been found to provide an etch rate of up to 100Å per minute for silicon nitride films. Deposited silicon dioxide has an etch rate of about 10Å per minute (a range of 0–25Å per minute depending upon temperature and preparation). Elemental silicon has an etch rate of about 3Å per minute. From 140–200° C., etch rates increase with temperature. Water content of the phosphoric acid plays an important role in etching of silicon nitride and silicon dioxide. At a constant temperature, addition of water increases the etch rate of silicon nitride and decreases the etch rate of silicon dioxide. A number of chemical bath reflux systems are commercially available that are specifically designed for phosphoric acid reflux, such as those sold under the NITRAN brand name by Lufran, Inc., of Streetsboro, Ohio.

A typical second pullback may be about 100 angstroms. Because the pullback removes nitride from all directions, the nitride layer 4 is thinned by the pullback. There is a limit of how thin the remaining pad nitride 4 can be. This limit depends on the CMP process, which uses the pad nitride as a stopping layer. Another limit is given by the fact that more pullback would cover more active area by the HDP oxide 7, which is therefore lost for the device.

Figure 1E:
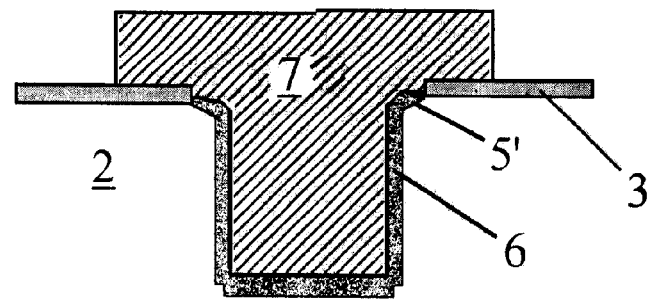

Referring to FIG. 1e, the trench is then filled with a protective fill, namely an HDP oxide 7 or TEOS fill. Again, as in the prior art, this protective fill will be polished down to the level of the nitride 4 by CMP and the nitride layer 4 then stripped away. Note that the invention is not limited to HDP oxide fill, any fill material could be used, such as TEOS. Note how the pad oxide layer 3 aids in the protection of the corners 5'.

HDP-CVD silicon oxide films may generally be formed by reacting silane gas ($SiH_4$) with oxygen ($O_2$) gas in the presence of electromagnetic radiation and an inert gas, such as Argon (Ar) or Helium (He).

As can now be seen, the method of the invention permits formation of a desired optimal corner rounding in the fabrication of semiconductor devices, while also permitting the user to give greater oxide protection to the corners by providing a much greater overlap of the HDP fill over the corners and by providing a larger opening for the HDP oxide to fill, thereby resulting in a better fill with less likelihood of internal cavities. Hence, the prior art need to tradeoff between optimal corner rounding and corner protection is eliminated.

Generally, the reaction pressure will be rather low, generally below ten mTorr, and will usually be conducted in a magnetron sputtering environment. Under these conditions, the film being deposited begins to cover all the surfaces on the wafer conformally, including the sidewalls and bottoms of contact holes and trenches. Under normal CVD processes, this would cause an overhang at the rims of the trenches and holes that would eventually close off at the top, thereby leaving a cavity within. However, in HDP deposition the excitation of the inert gases and reactants into a high-energy plasma causes the deposited material to be continuously sputtered away even as it is being deposited. The result is that the deposited material behaves like a fluid and settles into the trenches and holes in a planarized, rather than conformal, manner and thereby avoiding the formation of any cavities.

HDP-CVD reactors will generally utilize a glow discharge to produce ions powerful enough to cause sputtering in the material being deposited. Glow discharges are a self-sustaining plasma produced by either or both of a dc-diode type system or an rf-diode system. An inert gas, such as Argon is introduced between a pair of electrodes with a strong enough electric field to ionize the reactant and inert gases to a plasma. Rf-diode systems are preferred because they can operate at significantly lower pressures and deliver higher deposition rates than dc-diode systems. A preferred rf-diode system will be equipped with a magnetron source so as to help confine electrons near the wafer surface. Commercially popular systems include those sold under the tradename "Centura" by Applied Materials.

It is to be understood that all physical quantities disclosed herein, unless explicitly indicated otherwise, are not to be construed as exactly equal to the quantity disclosed, but rather as about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of filling an isolation trench etched through a silicon nitride layer down into a silicon substrate, comprising:

performing a first pullback of said nitride layer away from said trench so as to expose trench corners of said trench so as to optimize corner rounding as desired;

provided a silicon oxide trench liner for said trench;

performing a second pullback of said silicon nitride layer away from said trench so as to expose a sufficient amount of underlying layer adjacent to said trench corners to effectively protect said trench corners with a subsequent protective fill;

providing said protective fill of sufficient thickness to fill said trench and cover said substrate adjacent to said trench corners.

2. The method of claim 1 wherein:

said underlying layer comprises a silicon oxide layer binding said silicon nitride layer to said substrate;

said silicon oxide layer is etched back along with said silicon nitride layer during said first pullback; and said silicon oxide layer is not substantially etched during said second pullback.

3. The method of claim 2 wherein said first pullback is a hydrofluoric acid wet etch.

4. The method of claim 2 wherein said second pullback is a phosphoric acid wet etch.

5. The method of claim 1 wherein said second pullback etches back said nitride layer about 100 angstroms from said trench corners.

6. The method of claim 1 wherein said protective fill is a high density plasma silicon oxide fill.

7. The method of claim 1 wherein said protective fill is a TEOS fill.

8. The method of claim 1 wherein said trench liner is provided by thermal oxidation of the walls of said trench.

9. The method of claim 8 wherein said thermal oxidation is executed in a manner to optimize corner rounding.

10. A method of filling an isolation trench etched through silicon nitride and oxide layers down into a silicon substrate, said oxide layer binding said nitride layer to said substrate, comprising:

performing a first pullback of said nitride and oxide layers away from said trench so as to expose trench corners of said trench so as to optimize corner rounding as desired;

providing a silicon oxide trench liner for said trench;

performing a second pullback of said silicon nitride layer, but not of said silicon oxide layer, away from said trench so as to expose a sufficient amount of underlying silicon oxide layer adjacent to said trench corners to effectively protect said trench corners with a subsequent protective fill;

providing said protective fill of sufficient thickness to fill said trench and cover said substrate adjacent to said trench corners.

11. The method of claim 10 wherein said first pullback is a hydrofluoric acid wet etch.

12. The method of claim 10 wherein said second pullback is a phosphoric acid wet etch.

13. The method of claim 10 wherein said second pullback etches back said nitride layer about 100 angstroms from said trench corners.

14. The method of claim 10 wherein said protective fill is a high density plasma silicon oxide fill.

15. The method of claim 10 wherein said protective fill is a TEOS fill.

16. The method of claim 10 wherein said trench liner is provided by thermal oxidation of the walls of said trench.

17. The method of claim 16 wherein said thermal oxidation is executed in a manner to optimize corner rounding.

18. A method of filling an isolation trench etched through silicon nitride and oxide layers down into a silicon substrate, said oxide layer binding said nitride layer to said substrate, comprising:

performing a first pullback of said nitride and oxide layers away from said trench so as to expose trench corners of said trench so as to optimize corner rounding as desired;

providing a silicon oxide trench liner for said trench by thermal oxidation of the walls of said trench;

performing a second pullback of said silicon nitride layer, but not of said silicon oxide layer, away from said trench so as to expose a sufficient amount of underlying silicon oxide layer adjacent to said trench corners to effectively protect said trench corners with a subsequent protective fill;

providing said protective fill of sufficient thickness to fill said trench and cover said substrate adjacent to said trench corners, said protective fill of a material selected from high density plasma silicon oxide or TEOS;

planarizing said protective fill down to the level of said silicon nitride layer; and removing said silicon nitride and silicon oxide layers not covered by said protective fill.

* * * * *